(12) United States Patent
Lee

(10) Patent No.: US 9,691,438 B2
(45) Date of Patent: Jun. 27, 2017

(54) SEMICONDUCTOR DEVICE WITH HIERARCHICAL WORD LINE SCHEME

(71) Applicant: SK hynix Inc., Gyeonggi-do (KR)

(72) Inventor: Seol Hee Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/016,024

(22) Filed: Feb. 4, 2016

(65) Prior Publication Data

US 2017/0062022 A1    Mar. 2, 2017

(30) Foreign Application Priority Data

Sep. 2, 2015 (KR) .................. 10-2015-0124192

(51) Int. Cl.
*G11C 5/06* (2006.01)
*G11C 8/08* (2006.01)
*G11C 8/14* (2006.01)

(52) U.S. Cl.
CPC ............ *G11C 5/063* (2013.01); *G11C 5/06* (2013.01); *G11C 8/08* (2013.01); *G11C 8/14* (2013.01)

(58) Field of Classification Search
CPC .................................. G11C 5/06; G11C 7/222
USPC ...................... 365/63, 189.05, 226
See application file for complete search history.

(56) References Cited

U.S. PATENT DOCUMENTS

| | | | | |
|---|---|---|---|---|
| 5,706,243 A * | 1/1998 | Mori | ............... | G11O 5/063 345/519 |
| 5,864,496 A * | 1/1999 | Mueller | ............... | G11C 7/18 257/773 |
| 2002/0054530 A1 | 5/2002 | Chung et al. | | |
| 2003/0235089 A1 * | 12/2003 | Mueller | ............... | G11O 5/063 365/200 |
| 2009/0168480 A1 * | 7/2009 | Scheuerlein | ............. | B82Y 10/00 365/51 |
| 2009/0168481 A1 * | 7/2009 | Stipe | ............... | G11C 5/02 365/51 |
| 2010/0246241 A1 * | 9/2010 | Seko | ............... | G11O 5/063 365/148 |
| 2010/0265778 A1 * | 10/2010 | Yasuda | ............... | G11C 7/08 365/194 |
| 2010/0290262 A1 * | 11/2010 | Scheuerlein | ............. | B82Y 10/00 365/51 |
| 2012/0147651 A1 * | 6/2012 | Scheuerlein | ....... | G11C 13/0002 365/63 |
| 2013/0148411 A1 * | 6/2013 | Atsumi | ............... | G11C 8/08 365/149 |

(Continued)

FOREIGN PATENT DOCUMENTS

KR    100372249    2/2003

*Primary Examiner* — Michael Tran
(74) *Attorney, Agent, or Firm* — IP & T Group LLP

(57) ABSTRACT

A semiconductor device includes: first and second memory cell regions disposed adjacent to each other in a first direction, and suitable for sharing a sub-word line driving signal, and a first sub-word line driving unit disposed in a crossing area that is disposed between the first and second memory cell regions in a diagonal direction. The first sub-word line driving unit includes a first sub-word line driver for driving the first memory cell regions, a second sub-word line driver for driving the second memory cell regions, and an interconnection for transmitting the sub-word line driving signal, which extends in the first direction.

16 Claims, 6 Drawing Sheets

(56) References Cited

U.S. PATENT DOCUMENTS

2016/0155484 A1\* 6/2016 Lin .......................... G11C 8/14
 365/230.03

\* cited by examiner

SEMICONDUCTOR DEVICE WITH HIERARCHICAL WORD LINE SCHEME

CROSS-REFERENCES TO RELATED APPLICATION

The present application claims priority under 35 U.S.C. §119(a) to Korean application number 10-2015-0124192, filed on Sep. 2, 2015, in the Korean Intellectual Property Office, which is incorporated herein by reference in its entirety.

BACKGROUND

1. Technical Field

Various embodiments generally relate to a semiconductor device design, and more particularly, to a layout of sub-word line driving units included in a semiconductor device.

2. Related Art

A semiconductor memory device includes a plurality of memory cells arranged in two-dimensional or three-dimensional structures. A word line and a bit line are driven to store or read data to or from a memory cell. Since each of the memory cells is connected to a word line and a bit line that crosses the word line a specific memory cell may be selected by driving of a corresponding word line and a corresponding bit line.

Word lines may be configured according to a hierarchical scheme including main word lines and sub-word lines. For example, since four or eight sub-word lines correspond to one main word line, both a corresponding main word line and a corresponding sub-word line should be driven when a specific word line is driven.

SUMMARY

Various embodiments are directed to a semiconductor device, in which the configurations of sub-word line driving units arranged among a plurality of memory cell units are allowed to be equal to one another.

Various embodiments are directed to a semiconductor device, in which sub-word line driving units arranged between two adjacent memory cell units are configured to be symmetrical to each other.

In an embodiment, a semiconductor device includes: first and second memory cell regions disposed adjacent to each other in a first direction, and suitable for sharing a sub-word line driving signal; and a first sub-word line driving unit disposed in a crossing area that is disposed between the first and second memory cell regions in a diagonal direction, wherein the first sub-word line driving unit includes a first sub-word line driver for driving the first memory cell regions, a second sub-word line driver for driving the second memory cell regions—and an interconnection for transmitting the subword line driving signal, which extends in the first direction.

With the semiconductor device according to embodiments, the layouts of sub-word line driving units shared by memory cell units are allowed to be symmetrical to each other, so that process difficulty and pattern failure may be minimized.

With the semiconductor device according to embodiments, an entire pattern is simplified, so that design complexity may be minimized. As a consequence, it is possible to shorten a time required for entire design of the semiconductor device.

DETAILED DESCRIPTION

Various embodiments n are described below in more detail with reference to the accompanying drawings. These embodiments are provided so that this disclosure is thorough and complete to those skilled in the art to which the invention pertains. It is noted that the described embodiments are mere examples of the invention and are not intended to limit the scope of the invention.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" "comprising," "includes" and/or "including" when used in this specification, indicate the presence of stated features, but do not preclude the presence or addition of one or more other features. As used herein, the term "and/or" indicates any and all combinations of one or more of the associated listed items.

Hereinafter, various embodiments of the invention will be described below with reference to the accompanying drawings.

Figure 1:
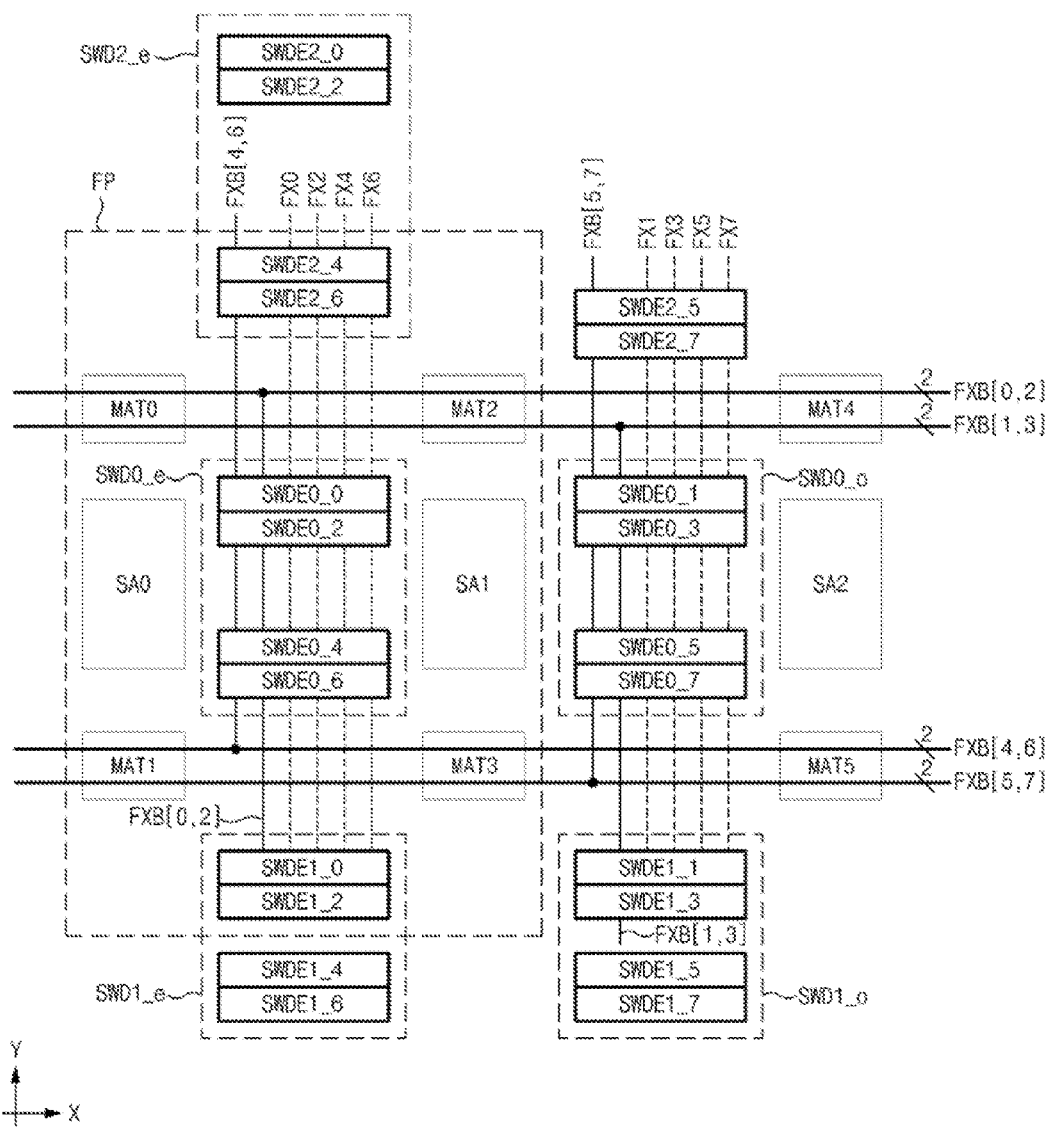
FIG. 1 is a plan view illustrating a layout of a semiconductor device, according to an embodiment.

FIG. 1 is a plan view illustrating a layout of a semiconductor device, according to an embodiment of the invention.

A semiconductor device 10 may include memory cell arrays. Each of the memory cell arrays includes a plurality of memory cells. The memory cells may be grouped into memory cell regions (hereinafter, referred to as memory mats MATs). As the integration degree of the semiconductor device 10 becomes high the length (or load) of word lines included increases, and thus a hierarchical word line scheme has been employed to reduce delays in word line driving. In the hierarchical word line scheme, the word lines may be divided into main word lines and sub-word lines.

As the word lines are divided into the main word lines and the sub-word lines, main word line drivers and sub-word line drivers may be separately required.

Referring to FIG. 1, the semiconductor device 10 may include a plurality of memory mats MAT0 to MAT5, a plurality of sub-word line driving units SWD0_e, SWD0_o, SWD1_0, and SWD1_e, and a plurality of sense amplifier units SA0 to SA2.

In a layout of the sub-word line driver, according to an embodiment, each of the sense amplifier units SA0 to SA2 may be arranged between adjacent memory mats in a second direction Y, for example, the sense amplifier units SA0 to SA2 may be arranged between mats MAT0 and MAT1, MAT2 and MAT3 and MAT4 and MAT5, respectively, Sub-word line driving units SWD0_e and SWD0_o may be arranged between adjacent sense amplifier units in a first direction X, for example sub-word line driving unit SWD0_e may be arranged between the sense amplifier units SA0 and SA1, and sub-word line driving unit SWD0_o may be arranged between sense amplifier units SA1 and SA2. In other words, the sub-word line driving units SWD0_e and SWD0_o may be arranged in a zigzag manner with respect to the memory mats MAT0 and MAT1, MAT2 and MAT3, and MAT4 and MAT5, which are adjacent to one another in the second direction Y. The first direction X and the second direction Y are different from each other and may be perpendicular to each other, The first even sub-word line driving unit SWD0_e is arranged between the first sense amplifier unit SA0 and the second sense amplifier unit SA1, which are adjacent to each other in the first direction X, and is arranged in a zigzag manner with respect to the first memory mat MAT0 and the second memory mat MAT1, which are adjacent to each other in the second direction Y.

The first even sub-word line driving unit SWD0_e may include a first sub-word line driver SWDE0_0, a third sub-word line driver SWDE0_2, a fifth sub-word line driver SWDE0_4, and a seventh sub-word line driver SWDE0_6.

A plurality of even sub-word line driving signals FX0, FX2, FX4, and FX6 provided to the first even sub-word line driving unit SWD0_e are shared by the first memory mat MAT0, the second memory mat MAT1, the third memory mat MAT2, and the fourth memory mat MAT3. In other words, even sub-word lines (not illustrated) included in the first memory mat MAT0 and the second memory mat MAT1, and the third memory mat MAT2 and the fourth memory mat MAT3 may be driver) by the plurality of common even sub-word line driving signals FX0, FX2, FX4, and FX6.

In general, the first even sub-word line driving unit SWD0_e may drive even sub-word lines of memory mats adjacent to one another in the first direction X. For example, the first even sub-word line driving unit SWD0_e may drive the same even sub-word lines of the first memory mat MAT0 and the third memory mat MAT2.

The layout of the sub-word line driver, according to an embodiment, has a 2-MAT sharing structure in which memory mats (for example, the first memory mat MAT0, the second memory mat MAT1, the third memory mat MAT2, and the fourth memory mat MAT3) adjacent to one another in the second direction Y share sub-word line driving signals (herein, the first sub-word line driving signal FX0, the third sub-word line driving signal FX2, the fifth sub-word line driving signal FX4, and the seventh sub-word line driving signal FX6).

Similarly, the first odd sub-word line driving unit SWD0_o is arranged between the second sense amplifier unit SA1 and the third sense amplifier unit SA2, which are adjacent to each other in the first direction X, and is arranged in a zigzag manner with respect to the third memory mat MAT2 and the fourth memory mat MAT3, which are adjacent to each other in the second direction Y.

A plurality of odd sub-word line driving signals FX1, FX3, FX5, and FX7 provided to the first odd sub-word line driving unit SWD0_o are shared by the third memory mat MAT2 the fourth memory mat MAT3 the fifth memory mat MAT4, and the sixth memory mat MAT5.

In general, the first odd sub-word line driving unit SWD0_o may drive only the same odd sub-word lines of memory mats adjacent to one another in the first direction X.

For example, the first odd sub-word line driving unit SWD0_o may drive only odd sub-word lines of the third memory mat MAT2 and the fifth memory mat MAT4. However, in the layout of the semiconductor memory device according to an embodiment, the first odd sub-word line driving unit SWD0_o may share odd sub-word line driving signals (herein, the second sub-word line driving signal FX1 the fourth sub-word line driving signal FX3, the sixth sub-word line driving signal FX5, and the eighth sub-word line driving signal FX7) among memory mats (for example, the third memory mat MAT2, the fourth memory mat MAT3, the fifth memory mat MAT4, and the sixth memory mat MATS) adjacent to one another in the second direction Y.

As described above, when the two memory mats adjacent to each other in the second direction Y are driven by sharing the sub-word line driving signals, all the sub-word lines of the first to sixth memory mats MAT0 to MAT 5 may be driven through the first even sub-word line driving unit SWD0_e and the first odd sub-word line driving unit SWD0_o.

In such a case, for example, the second even sub-word line driving unit SWD1_e, the second odd sub-word line driving unit SWD1_0, and the third even sub-word line driving unit SWD2_e of FIG. 1 may not be provided. When the second even sub-word line driving unit SWD1_e and the second odd sub-word line driving unit SWD1_0 are not provided, all the sub-word line driving units and the memory mats may be asymmetrically connected to each other.

The asymmetrical connection of the sub-word line drivers included in the sub-word line driving unit and the sub-word lines of the memory mats and the layout according to an embodiment will be described below. A configuration corresponding to a unit area FP of FIG. 1 will be described in detail with reference to FIGS. 2A, 2B, 3A, and 3B.

Hereinafter, the same reference numerals are used to designate substantially the same elements, and a description thereof may be partially omitted to avoid redundancy. Furthermore, in the present specification, the case in which the main word line and the sub-word lines have a relation of 1:8 has been illustrated as an example; however, the present invention is not limited thereto, and the relation of the memory mats, the main word line, and the sub-word lines may be defined through various decoding schemes such as 1:4 and 1:16.

Figure 2A:
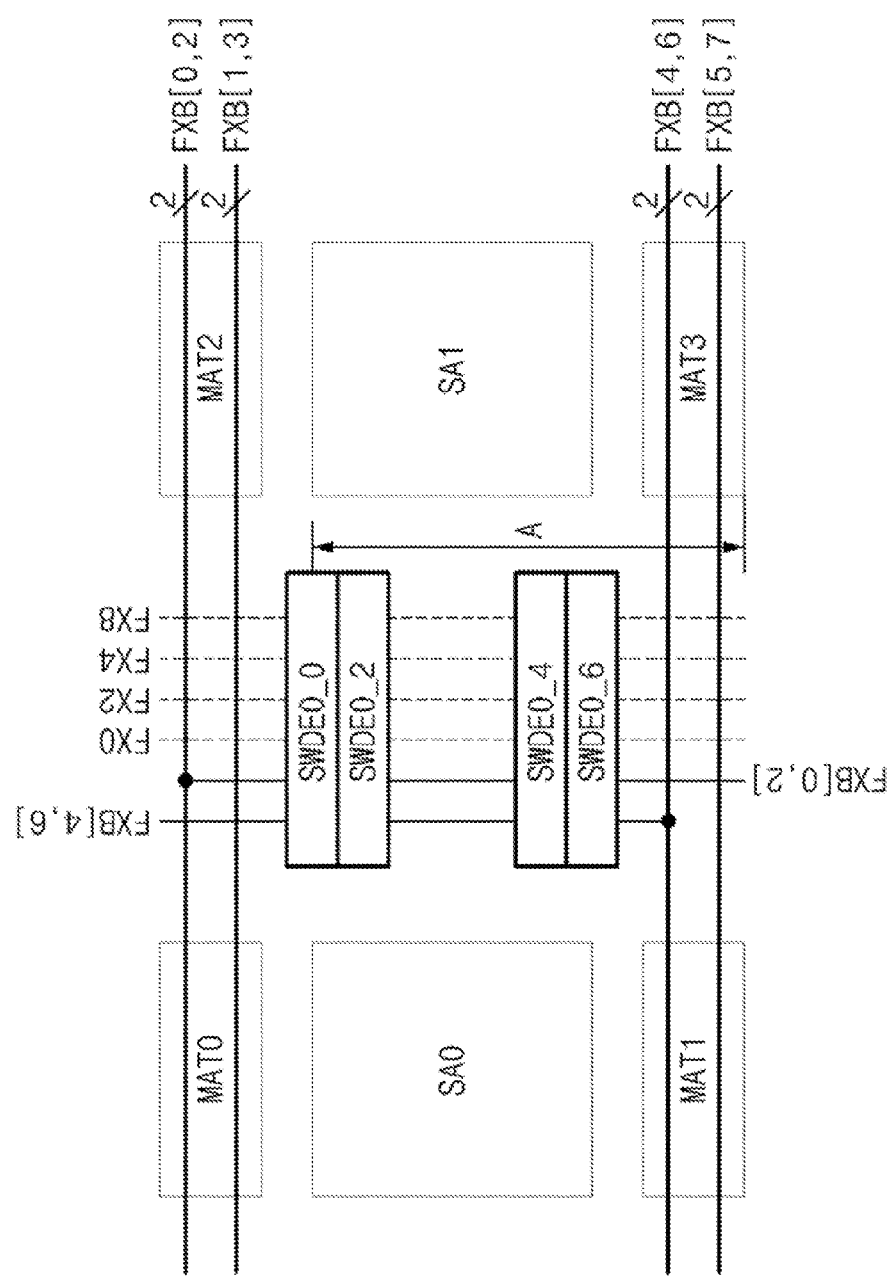
FIG. 2A is a plan view illustrating the case in which memory mats and sub-word line driving units arranged in a zigzag manner are partially omitted in a layout corresponding to a unit area of FIG. 1.

FIG. 2A is a plan view illustrating the case in which memory mats and sub-word line driving units arranged in a zigzag manner are partially omitted in the layout corresponding to the unit area of FIG. 1.

Referring to FIG. 2A, when sub-word line driving units are partially omitted in a crossing area (that is, a zigzag area) between memory mats adjacent to each other in the second direction Y, an asymmetrical connection configuration is obtained, For example, the first sub-word line driver SWDE0_0 may drive a first sub-word line SWL0 (not illustrated) of the first to fourth memory mats MAT0 to MAT3 based on the first sub-word line driving signal FX0 and a first complementary sub-word line driving signal FXB0.

In this case, a distance between the first sub-word line included in the first memory mat MAT0 and the third memory mat MAT2 and the first sub-word line driver SWDE0_0 is relatively short. However, a distance between the first sub-word line included in the second memory mat MAT1 and the fourth memory mat MAT3, and the first sub-word line driver SWDE0_0 is indicated by 'A' in FIG. 2A. A significant difference may exist between a distance between the first memory mat MAT0/the third memory mat MAT2 and the first sub-word line driver SWDE0_0 and 'A'.

Similarly, the seventh sub-word line driver SWDE0_6 may drive a seventh sub-word line SWL6 (not illustrated) of the first to fourth memory mats MAT0 to MAT3 based on the seventh sub-word line driving signal FX6 and a seventh complementary sub-word line driving signal FXB6. Also in this case, a significant difference may exist between a distance between the seventh sub-word line included in the first memory mat MAT0 and the third memory mat MAT2 and the seventh sub-word line driver SWDE0_6 and a distance between the seventh sub-word line included in the second memory mat MAT1 and the fourth memory mat MAT3 and the seventh sub-word line driver SWDE0_6.

Figure 2B:
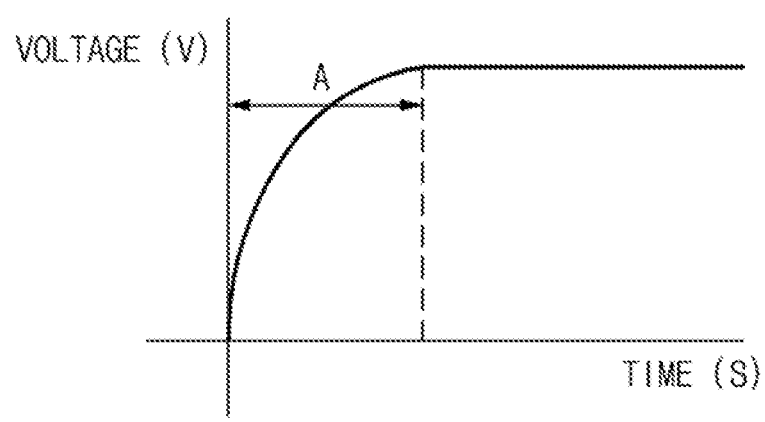
FIG. 2B is a diagram illustrating the time ('A') required until sub-word lines are activated after sub-word line driving signals are actually activated, according to an embodiment.

FIG. 2B is a diagram for explaining a time for which driving signals are substantially activated in the sub-word lines of the memory mats MAT0 to MAT3 when each memory mat is asymmetrically connected to the sub-word line driving unit in the case in which two adjacent memory mats share the sub-word line driving signals as illustrated in FIG. 2A.

In FIG. 2, an X axis may denote a time (S) and a Y axis may denote a voltage (V).

Since a distance between sub-word lines included in each memory mat and the sub-word line drivers SWDE0_0, SWDE0_2, SWDE0_4, and SWDE0_6 is large, the first complementary sub-word lo line driving signal FXB0 should be provided to the first sub-word line driver SWDE0_0 and then should be provided to the first sub-word line of the fourth memory mat MAT3 so that the first sub-word line included in the fourth memory mat MAT3 is driven for example.

As apparent from FIG. 2A, since a maximum distance between the first sub-word line driver SWDE0_0 and the fourth memory mat MAT3 is large a significant time ('A' of FIG. 2B) is required until sub-word lines are activated after the sub-word line driving signals FX0 and FXB0 are actually activated.

However, since the distance between the first sub-word line driver SWDE0_0 and the third memory mat MAT2 is short, a time required for transmitting the first sub-word line driving signals FX0 and FXB0 to the first sub-word line of the third memory mat MAT2 may be further shortened.

As described above, when distance differences exist among the sub-word line drivers SWDE0_0, SWDE0_2, SWDE0_4, and SWDE0_6 that drive the memory mats MAT0 to MAT3, since the sub-word line driving signals FX0, FX2, FX4, and FX6 reach sub-word lines through interconnections with different distances, a difference occurs in signal transfer times.

Therefore, the sub-word lines included in the memory mats should be driven at the same time point but since a difference occurs in driving times, operation times are not uniform. As a consequence, since the accuracy of data writing and reading may be reduced, the semiconductor device may not stably operate.

Furthermore, in order to connect the even sub-word lines (for example, the first, third, fifth, and seventh sub-word lines) included in the first memory mat MAT0 to the sub word line drivers SWDE0_0, SWDE0_2, SWDE0_4, and SWDE0_6, metal interconnections should be designed.

However, when the first memory mat MAT0 and the second memory mat MAT1 are connected to the same sub-word line drivers SWDE0_0, SWDE0_2, SWDE0_4, and SWDE0_6, the patterns of metal interconnections for connecting each of the first memory mat MAT0 and the second memory mat MAT1 to the sub-word line drivers SWDE0_0, SWDE0_2, SWDE0_4, and SWDE0_6 become asymmetric.

In detail, the first memory mat MAT0 is connected to the first sub-word line driver SWDE0_0 through a short interconnection in the fourth quadrant direction about the first memory mat MAT0, but the second memory mat MAT1 is connected to the first sub-word line driver SWDE0_0 through a relatively long interconnection in the first quadrant direction about the second memory mat MAT1. That is, connections between the memory mats adjacent to each other in the second direction Y and the sub-word line drivers become asymmetric.

Similarly, metal interconnections for connecting the even sub-word lines included in the third memory mat MAT2 and the fourth memory mat MAT3 to the sub-word line drivers SWDE0_0, SWDE0_2, SWDE0_4, and SWDE0_6 also have an asymmetrical pattern.

In the case of designing the layout of the semiconductor memory device 10, the same elements should be relatively and repetitively arranged. However, when the asymmetrical pattern is formed as described above, since other elements should be designed in consideration of the asymmetrical pattern, design may be complicated or a fabrication process itself may be complicated.

In accordance with the layout of the sub-word line drivers of the semiconductor memory device according to an embodiment, odd though sub-word line driving signals are shared between two memory mats adjacent to each other in the second direction Y each memory mat and all sub-word line driving units are arranged in a zigzag manner, so that the sub-word line driving units may be symmetrically connected to the memory mats.

Figure 3A:
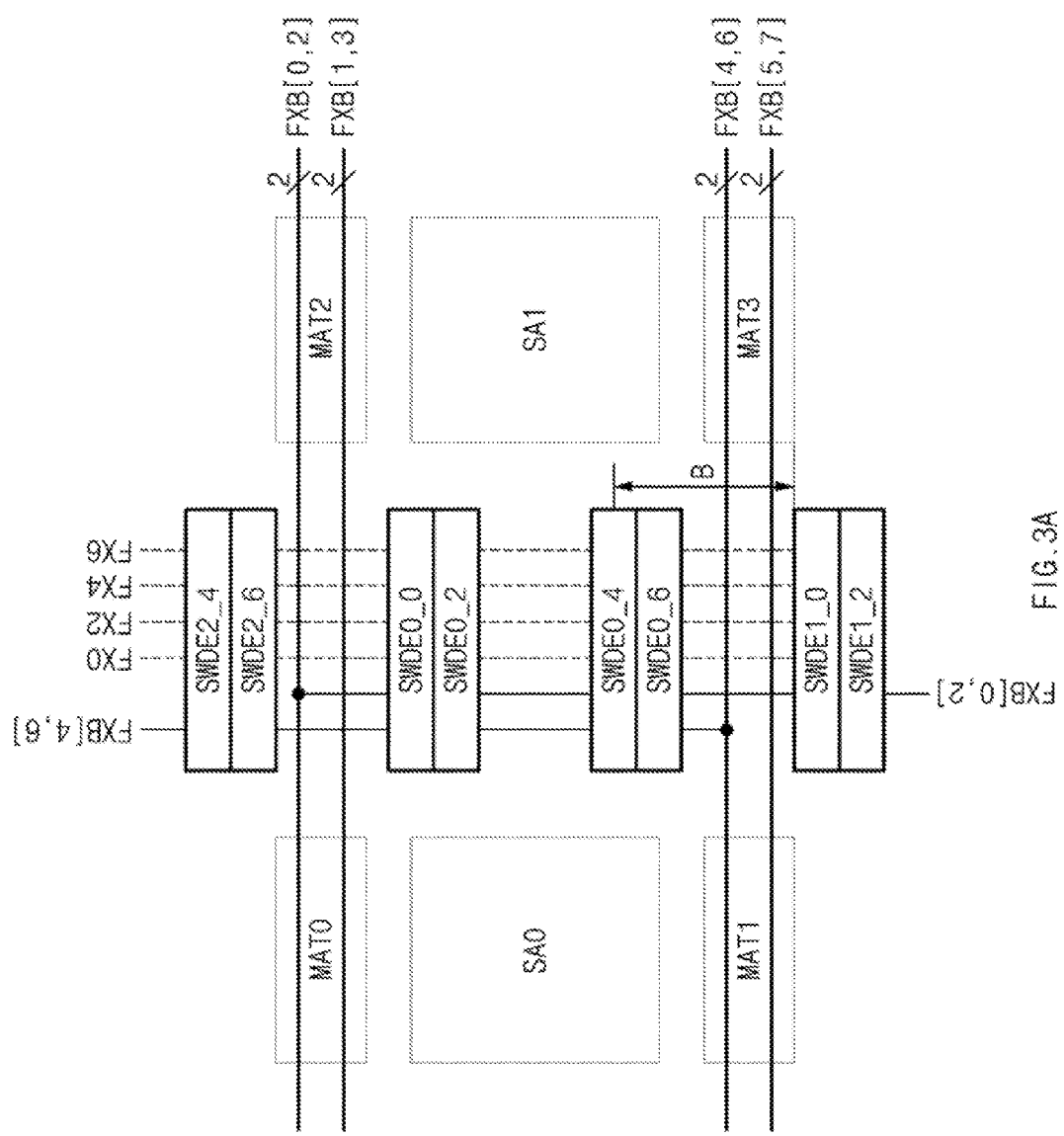
FIG. 3A is a diagram illustrating a symmetrical pattern with reference to a unit area of FIG. 1.

FIG. 3A is a diagram for emphatically explaining a symmetrical pattern with reference to the unit area of FIG. 1. With reference to FIGS. 1 and 3A, the layout of sub-word line drivers according to an embodiment will be described in detail.

Referring to FIGS. 1 and 3A, the memory mats MAT0 to MAT5, which are adjacent to one another in the first direction X and the second direction Y, and sub-word line driving units are arranged in all areas in a zigzag direction, At a right upper portion of the first memory mat MAT0, that is, a left upper portion of the third memory mat MAT2, a fifth sub-word line driver SWDE2_4 and a seventh sub-word line driver SWDE2_6 included in the third even sub-word line driving unit SWD2_e may be arranged. According to embodiments, the third even sub-word line driving unit SWD2_e may also include first and third sub-word line drivers SWDE2_0 and SWDE2_2.

At a right lower portion of the second memory mat MAT1, that is, a left lower portion of the fourth memory mat MAT3, a first sub-word line driver SWDE1_0, a third sub-word line driver SWDE0_2, a fifth sub-word line driver SWDE1_4, and a seventh sub-word line driver SWDE1_6 included in the second even sub-word line driving unit SWD1_e may be arranged.

However, according to embodiments, in the second even sub-word line driving unit SWD1_e positioned at the right lower portion of the second memory mat MAT1, that is, the left lower portion of the fourth memory mat MAT3, the first sub-word line driver SWDE1_0 and the third sub-word line driver SWDE0_2 may be included and sub-word line drivers for driving first and third sub-word lines of other memory mats, which may be positioned below the first sub-word line driver SWDE1_0 and the third sub-word line driver SWDE0_2, may also be further included.

In the layout of the semiconductor device according to an embodiment, a layout may be repeated by employing the unit area FP as a basic unit. Accordingly, the unit area FP (see FIG. 1) may be repeated as is and the fifth sub-word line driver SWDE1_4 and the seventh sub-word line driver SWDE1_6 may also be arranged below the first sub-word line driver SWDE1_0 and the third sub-word line driver SWDE0_2, but mirror symmetry may be repeated and sub-word line drivers for driving first and third sub-word lines of other memory mats positioned below the second even sub-word line driving unit SWD1_e may be included.

The first sub-word line and the third sub-word line of the first memory mat MAT0 and the third memory mat MAT2 are respectively connected to the first sub-word line driver SWDE0_0 and the third sub-word line driver SWDE0_2 included in the first even sub-word line driving unit SWD0_e. The first sub-word line and the third sub-word line of the second memory mat MAT1 and the fourth memory mat MAT3 may be connected to the first sub-word line driver SWDE1_0 and the third sub-word line driver SWDE1_2 included in the second even sub-word line driving unit SWD1_e.

Similarly, the fifth sub-word line and the seventh sub-word line of the first memo mat MAT0 and the third memory mat MAT2 are connected to the fifth sub-word line driver SWDE2_4 and the seventh sub-word line driver SWDE2_6 included in the third even sub-word line driving unit SWD2_e positioned above both memory mats MAT0 and MAT2. The fifth sub-word line and the seventh sub-word line of the second memory mat MAT1 and the fourth memory mat MAT3 may be connected to the fifth sub-word line driver SWDE0_4 and the seventh sub-word line driver SWDE0_6 included in the first even sub-word line driving unit SWD0_e.

That is, the first, third, fifth, and seventh sub-word line driving signals FX0, FX2, FX4, and FX6 are shared by the first even sub-word line driving unit SWD0_e, the first and third sub-word line drivers SWDE1_0 and SWDE1_2 of the second even sub-word line driving unit SWD1_e, and the fifth and seventh sub-word line drivers SWDE2_4 and SWDE2_6 of the third even sub-word line driving unit SWD2_e, and drive all the even sub-word lines of the first to fourth memory mats MAT0 to MAT3.

Respective memory mats are connected to the nearest sub-word line drivers, and there is no almost difference in distances between the first to fourth memory mats MAT0 to MAT3 and sub-word line drivers connected to sub-word lines.

Furthermore, metal interconnections between the respective memory mats and sub-word line drivers connected to the respective memory mats have a symmetric configuration. In detail, the metal interconnection through which the first sub-word line of the first memory mat MAT0 and the first sub-word line driver SWDE0_0 included in the first even sub-word line driving unit SWD0_e are connected to each other, and the metal interconnection, through which the first sub-word line of the second memory mat MAT1 and the first sub-word line driver SWDE1_0 included in the second even sub-word line driving unit SWD1_e are connected to each other, have the same direction and length.

Similarly, the metal interconnection, through which the lo second sub-word line of the third memory mat MAT2 and the second sub-word line driver SWDE0_1 included in the first even sub-word line driving unit SWD0_e are connected to each other, and the metal interconnection, through which the second sub-word line of the fourth memory mat MAT3 and the second sub-word line driver SWDE1_1 included in the second even sub-word line driving unit SWD1_e are connected to each other, have the same direction and length.

That is, since the metal interconnections, through which each sub-word line and the memory mats are connected to each other, have a symmetrical configuration, a fabrication process may also be simplified as well as layout design.

Figure 3B:
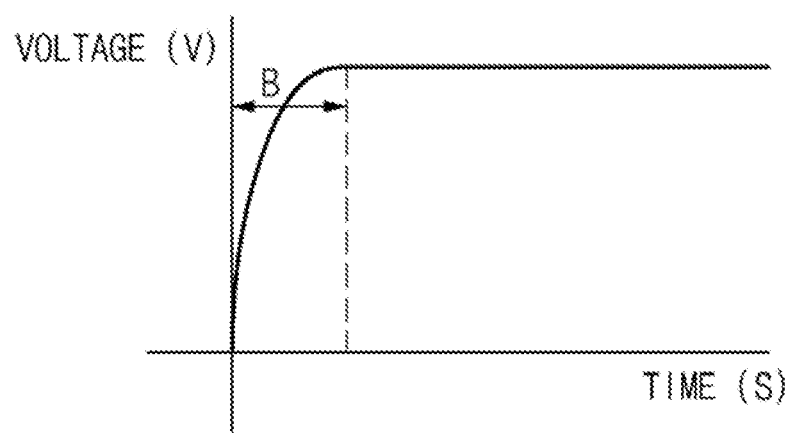
FIG. 3B is a diagram illustrating a distance between the memory mats and the sub-word line driving units in the layout of FIG. 3A.

FIG. 3B is a diagram illustrating a driving time of sub-word lines included in memory mats in accordance with the layout of the semiconductor device according to an embodiment. Similarly to FIG. 2B, in FIG. 3B, an X axis may denote a time (S) and a Y axis may denote a voltage (V).

As compared with FIG. 2B, in the layout of FIG. 3B, a distance difference between the sub-word lines included in the memory mats and the sub-word line driver has been considerably reduced. Accordingly, even in the case of sub-word lines included in any memory mat, when the time illustrated in FIG. 3B lapses, a driving signal is activated. That is, as compared with FIG. 2B, a maximum delay time required for driving the sub-word line is reduced.

As described above, a case, in which a connection distance between the second memory mat MAT1/the fourth memory mat MAT3 and the sub-word line driver is the largest, is a case in which the second memory mat MAT1 and the fourth memory mat MAT3 are connected to the third sub-word line driver SWDE1_3 included in the second even sub-word line driving unit SWD1_e (see FIG. 1) or the fifth sub-word line driver SWDE0_4 included in the first even sub-word line driving unit SWD0_e (see FIG. 1). At this time a time, for which the fifth sub-word line of the fourth memory mat MAT3 is driven from the fifth sub-word line driver SWDE0_4 and the driving signal is activated, corresponds to 'B'.

As compared with 'A' illustrated in FIG. 2A and FIG. 2B, 'B' has been significantly reduced. It represents that a time for transmitting sub-word line driving signals to sub-word lines is reduced. For example, when the sub-word line driving signals are shared by two or more memory mats, transfer times of the sub-word line driving signals among the memory mats are almost equal to one another.

Consequently, in accordance with the layout of the semiconductor device according to an embodiment, it is possible to reduce a distance between sub-word lines and sub-word line drivers. In addition, in the case of driving the same sub-word lines as described above, distances between sub-word lines of each memory mat and sub-word line drivers are substantially equal to one another.

In FIG. 2A, in the case of driving the first sub-word line, there is a significant difference in distances between the first memory mat MAT0/the third memory mat MAT2 and the first sub-word line driver SWDE0_0, and between the second memory mat MAT1/the fourth memory mat MAT3 and the first sub-word line driver SWDE0_0.

However, in FIG. 3A, when driving the first sub-word line of each memory mat, since the first memory mat MAT0 and the third memory mat MAT2 are connected to the first sub-word line driver SWDE0_0 included in the first even sub-word line driving unit SWD0_e and the second memory mat MAT1 and the fourth memory mat MAT3 are connected to the first sub-word line driver SWDE1_0 included in the second even sub-word line driving unit SWD1_e, distances between all the memory mats and the sub-word line drivers are substantially equal to one another.

In accordance with the layout of the semiconductor device according to an embodiment, since there is no time difference of sub-word line driving signals the entire operation characteristics of the semiconductor device may be improved.

Furthermore, in the case of utilizing the layout of the sub-word line drivers of the semiconductor device according to an embodiment, metal interconnections for connecting the sub-word line drivers to memory mats become symmetric as well as the arrangements of the sub-word line drivers.

Consequently, the arrangement of the entire semiconductor memory device may be simply performed and different layouts need not to be provided depending on the position of a specific memory mat in fabricating the semiconductor memory device, so that an entire fabrication process may be simplified.

Figure 4:
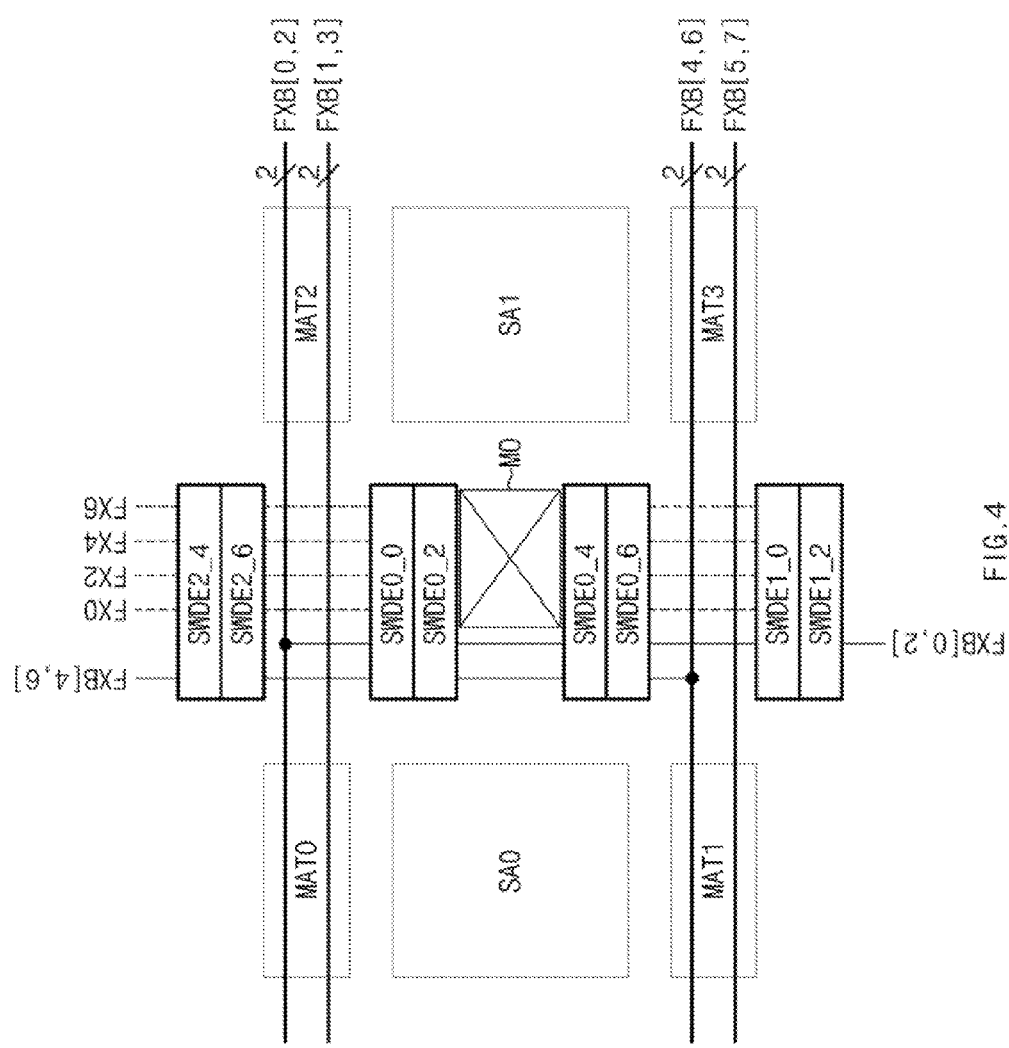
FIG. 4 is a plan view illustrating the layout of a semiconductor device, according to another embodiment.

FIG. 4 is a plan view illustrating the layout of the semiconductor device according to another embodiment.

As described above, in the layout of the semiconductor device according to an embodiment, two adjacent memory mats adjacent to each other in the second direction Y share the sub-word line driving signal FX.

Since two memory mats (for example the first memory mat MAT0/the second memory mat MAT1 and the third memory mat MAT2/the fourth memory mat MAT3) are connected to sub-word line drivers adjacent to each other upward or downward there may exist a vacant area MO where an interconnection for transmitting the sub-word line driving signal FX extending in the second direction Y is not disposed.

The fifth and seventh sub-word lines of the first memory mat MAT0 and the third memory mat MAT2 are connected to the fifth and seventh sub-word line drivers SWDE2_4 and SWDE2_6 included in the third even sub-word line driving unit SWD2_e, and the fifth and seventh sub-word lines of the second memory mat MAT1 and the fourth memory mat MAT3 are connected to the fifth and seventh sub-word line drivers SWDE0_4 and SWDE0_6 included in the first even sub-word line driving unit SWD0_e. Accordingly, the fifth and seventh sub-word line driving signals FX4 and FX6 have not only to extend along the vacant area MO.

Similarly, the first and third sub-word lines of the first memory mat MAT0 and the third memory mat MAT2 are connected to the first and third sub-word line drivers SWDE0_0 and SWDE0_2 included in the first even sub-word line driving unit SWD0_e, and the first and third sub-word lines of the second memory mat MAT1 and the fourth memory mat MAT3 are connected to the first and third sub-word line drivers SWDE1_0 and SWDE1_2 included in the second even sub-word line driving unit SWD1_e. Accordingly, the first and third sub-word line driving signals FX0 and FX2 have not only to extend along the vacant area MO.

Consequently, in accordance with the layout of the semiconductor device according to an embodiment, even when metal interconnections for transmitting sub-word line driving signals to be shared by memory mats adjacent to one another in the second direction Y extend in the second direction the metal interconnections may be partially omitted. Consequently, a material for the metal interconnections may be reduced and other metal areas of a sub-hole (i.e. a crossing area) may also be ensured.

As described above, in the layout of the semiconductor device according to an embodiment, sub-word line driving units for driving memory mats sharing sub-word line driving signals in the second direction are arranged in a zigzag manner and are symmetrically connected to the memory mats. Consequently, the entire layout achieves symmetry, so that process difficulty and pattern failure may be reduced.

In the layout of the semiconductor device according to an embodiment, since memory mats share sub-word line driving signals, the distances of interconnections between sub-word lines of each memory mat and sub-word line drivers are substantially equal to one another so that a difference in word line driving times may be minimized.

While various embodiments have been described above, it will be understood to those skilled in the art that the embodiments described are by way of example only. Accordingly, the layout of the semiconductor device described herein should not be limited based on the described embodiments. Many other embodiment and variation thereof may be envisioned by those skilled in the art to which this invention pertains without departing from the spirit and scope of the present invention as defined in the appended claims.

What is claimed is:

1. A semiconductor device, comprising:
    first and second memory cell regions disposed adjacent to each other in a first direction, and suitable for sharing a sub-word line driving signal; and
    a first sub-word line driving unit disposed in a crossing area that is disposed between the first and second memory cell regions in a diagonal direction,
    wherein the first sub-word line driving unit includes a first sub-word line driver for driving the first memory cell regions, a second sub-word line driver for driving the second memory cell regions, and an interconnection for transmitting the sub-word line driving signal, which extends in the first direction.

2. The semiconductor device of claim 1, wherein each of the first and second memory cell regions includes a first sub-word line area and a second sub-word line area, and the sub-word line areas are simultaneously driven on a basis of the shared sub-word line driving signal.

3. The semiconductor device of claim 2, further comprising:
    a second sub-word line driving unit arranged below the first sub-word line driving unit in the first direction,
    wherein the second sub-word line area of the second memory cell region is connected to the second sub-word line driving unit.

4. The semiconductor device of claim 3, further comprising:
    a third sub-word line driving unit arranged above the first sub-word line driving unit in the first direction,
    wherein the first sub-word line area of the first memory cell region is connected to the third sub-word line driving unit.

5. The semiconductor device of claim 4, wherein each of the second and third sub-word line driving units includes first and second sub-word line drivers, and
    the first sub-word line driver and the second sub-word line driver of the first sub-word line driving unit, the first sub-word line driver of the second sub-word line driving unit, and the second sub-word line driver of the third sub-word line driving unit are driven on a basis of a same sub-word line driving signal.

6. The semiconductor device of claim 5, wherein the first sub-word line driver of the second sub-word line driving unit is connected to the second sub-word line area of the second memory cell region.

7. The semiconductor device of claim 6, wherein the second sub-word line driver of the third sub-word line driving unit is connected to the first sub-word line area of the first memory cell region.

8. The semiconductor device of claim 7, wherein each of the first to third sub-word line driving units includes a vacant area where the interconnection for transmitting the sub-word line driving signal does not extend between the first and second sub-word line driving units thereof.

9. The semiconductor device of claim 6, further comprising:
an interconnection for transmitting a complementary sub-word line driving signal arranged in the first and second memory cell regions to extend in a second direction.

10. The semiconductor device of claim 6, further comprising:
a third memory cell region arranged to face the first memory cell region in the second direction; and
a four memory cell region arranged to face the second memory cell region in the second direction,
wherein sub-word lines included in the third and fourth memory cell regions are driven in a same manner as sub-word lines of the first and second memory cell regions.

11. The semiconductor device of claim 10, wherein each of the third and fourth memory cell regions includes a first sub-word line area and a second sub-word line area,
the first sub-word line area of the third memory cell region is connected to the second sub-word line driver of the third sub-word line driving unit, and the second sub-word line area of the fourth memory cell region is connected to the first sub-word line driver of the second sub-word line driving unit.

12. The semiconductor device of claim 11, wherein the second sub-word line area of the third memory cell region is connected to the first sub-word line driver of the first sub-word line driving unit, and the first sub-word line area of the fourth memory cell region is connected to the second sub-word line driver of the first sub-word line driving unit.

13. The semiconductor device of claim 11, wherein the sub-word lines include even or odd sub-word lines.

14. The semiconductor device of claim 11, further comprising:
a sense amplifier unit arranged between the first and second memory cell regions or the third and fourth memory cell regions, which are adjacent to each other in the first direction.

15. The semiconductor device of claim 2, wherein the first and second sub-word line areas include memory cells connected to at least one sub-word line, and
the first and second sub-word line drivers correspond to sub-word lines included in the first and second sub-word line areas.

16. The semiconductor device of claim 1,
wherein the first sub-word line driver is disposed closer to the first memory cell region than the second memory cell region, and
wherein the second sub-word line driver is disposed closer to the second memory cell region than the first memory cell region.

* * * * *